United States Patent [19]

Omote et al.

[11] Patent Number: 5,001,034
[45] Date of Patent: Mar. 19, 1991

[54] IMAGE TRANSFER METHOD

[75] Inventors: Hisahiro Omote; Masahiro Yoshikawa; Masahide Takano, all of Higashi-matsuyama, Japan

[73] Assignee: Sanyo-Kokusaku Pulp Co., Ltd., Tokyo, Japan

[21] Appl. No.: 362,927

[22] Filed: Jun. 8, 1989

[30] Foreign Application Priority Data

Mar. 31, 1989 [JP] Japan ................................. 1-82692

[51] Int. Cl.$^5$ ............................................. G03C 11/12
[52] U.S. Cl. ..................................... 430/257; 430/292
[58] Field of Search ................................. 430/257, 292

[56] References Cited

U.S. PATENT DOCUMENTS 4,719,169 1/1988 Platzer et al. ...................... 430/293

OTHER PUBLICATIONS

Abstract of JP 61-286850 12/17/86.
Abstract of JP 61-286858 12/17/86.

Primary Examiner—Jack P. Brammer
Attorney, Agent, or Firm—Oblon, Spivak, McClelland, Maier & Neustadt

[57] ABSTRACT

An image transfer method is disclosed, characterized in for the preparation of a color proof wherein separate-in-color images are formed in each colored photosensitive layer of photosensitive material coated on a thermosensitive adhesive layer on a release surface provided on a support from which the thermosensitive adhesive layer is releasable, and a multicolor image is formed on an image receiver by transferring said separate-in-color images onto said image receiver one by one together with said adhesive layer, repeating concurrent heating and pressurizing procedures, and thereafter further submitting the image receiver with the multicolor image formed thereon to heat treatment.

3 Claims, No Drawings

IMAGE TRANSFER METHOD

BACKGROUND OF THE INVENTION

The present invention relates to a transfer method for multi-color-forming materials and, in more detail, is concerned with a method of preparation of color proof used for the proofing operation in a photoengraving process.

In color printing, it is necessary to confirm beforehand the finish of printing for checking of color, tone, etc. obtained on finishing of printing at a step on the verge of plate-making, i.e. at the step of half-tone positive or half-tone negative prior to making the printing plate, or for checking of confirmation etc. by the orderer of the printing at the step of the proof sheet preparation. For this purpose, the color proof is prepared and the checking is made. With respect to this color proof, there have primarily been the surprint method, overlay method and transfer method hitherto depending on the forms thereof. In the surprint method, respective colored photosensitive liquors are coated in sequence onto a sheet of white support while repeating the printings from original plates of respective colors decomposed to form a multicolor image. Moreover, in the overlay method, printings are made from original plates of respective colors decomposed onto transparent supports coated with colored photosensitive liquors corresponding to respective colors to offer to the proofing by superposing them.

The invention relates to the transfer method described in Japanese Unexamined patent Publication No. Sho 61-286850, Sho 61-286858, etc. In this method, the exposure to light for imaging is given to a photosensitive sheet formed of a thermosensitive adhesive layer and a colored photosensitive layer in sequence onto a release surface provided on a support from which the thermosensitive adhesive layer is releasable and, after the development treatment, the image surface of the image-carrying sheet produced is superposed on a thermosensitive adhesive layer of an intermediate image-receiving sheet having only the thermosensitive adhesive layer on the release surface of the support from which the thermosensitive adhesive layer is releasable. By repeating then the concurrent heating and pressurizing, the images of image-carrying sheets are transferred in sequence onto the intermediate image-receiving sheet together with the adhesive layer to form a multicolor image. Further, this multicolor image on the intermediate image-receiving sheet is superposed on an arbitrary image receiver and, by heating and pressurizing concurrently, the multicolor image is formed on the arbitrary image receiver.

Concretely, yellow, magenta, cyan and black color images are formed, respectively, using four said photosensitive materials and these are transferred in sequence (regardless of the order) onto a same intermediate image-receiving sheet, thereby forming a multi-color image. Further, in order to bring this color proof close to the finish of printed matter, said intermediate image-receiving sheet with the multicolor image formed thereon is placed on an arbitrary image receiver, e.g. coated paper, art paper, newsprint paper or the like and, by heating and pressurizing concurrently, the multicolor image can be formed on the arbitrary image receiver. Moreover, if the image receiver is a material capable of being transferred with the thermosensitive adhesive layer and the colored photosensitive layer of the image-carrying sheets of the respective colors, it is also possible to transfer directly the image on the image-carrying sheet without using the intermediate image-receiving sheet.

When transferring the images in this way, however, as a factor affecting on the quality of finish, the adhesion between the image-carrying sheet and the image receiver when transferring the image can be mentioned. If the adhesion is poor, voids would be generated between the image layers of the respective colors resulting in the lowering in image density and the reduction in sharpness and saturation of the final finish due to those voids. Moreover, because the dot gain becomes a large amount, the color reproducibility of the transferred image is poor. As methods for improving the adhesion, there are a method to increase the thickness of thermosensitive adhesive layer and a method to modify the material in a way such as softening of the thermosensitive adhesive layer or the like. In the case of the former, however, if the final image receiver is paper, the image formed cannot reproduce the unevenness of paper to make the finish of printed matter different from original. Also, in the case of the latter, there arise such problems in operation as are apt to cause blocking and other problems.

As a method to improve the adhesion by the transfer method, there is a method of pressurizing under higher pressure or heating at high temperature. However, since said image-carrying sheet and said image-receiving sheet are all composed of soft materials, such problems that occurs are that both sheets which are superposed are warped when pressurizing under higher pressure or heating at high temperature by the use of a heat roller, that slipping-out of position is caused between said both sheets and that creases etc. generated on transporting through the heat roller may arise at the time of transfer treatment. Hence, a method is conceivable, wherein the image-carrying sheets are transferred in sequence onto the same intermediate image-receiving sheet under appropriate pressure and at appropriate temperature without causing the slipping-out of position to form the multicolor image and thereafter high pressure and high temperature are applied when transferring onto the final image receiver such as paper or the like. With this method, however, many voids are present between respective color layers since a plurality of colors are transferred onto the intermediate image-receiving sheet, it is hard for the air in voids to escape from the surface of intermediate image-receiving sheet since the support of the intermediate image-receiving sheet is mounted on the image receiver, the creases end up being generated on the image receiver on transporting through the heat roller since high pressure and high temperature are applied for the transfer, and so on. This cannot be said therefore to be a method satisfying the desired final finish.

As a result of diligent investigations on the transfer method to solve the problems aforementioned, the inventors have found a transfer method without said drawbacks leading to the completion of the invention.

SUMMARY OF THE INVENTION

The invention provides a transfer method characterized in that, in addition to the conventional transfer method, the image receiver with the multicolor image formed is submitted to heat treatment as a post-process stop thereof. In this method, the image transfer treatments are carried out in sequence by pressurizing and heating concurrently with a heat roller in accordance with the prior art. After having been transferred onto the final image receiver, the image receiver with the multicolor image formed is submitted to heat treatment using drier, fuser (infrared radiant type) or the like after being released by removal of the support of the image-carrying sheet when transferring the image-carrying sheet directly onto the final image receiver, or after being released by removal of the support of an intermediate image-receiving sheet when transferring onto the final image receiver using an intermediate image-receiving sheet.

DETAILED DESCRIPTION OF THE INVENTION

The transfer method will be explained below in more detail.

(1) Similarly to the conventional method, the exposure to light for imaging is first given to the photosensitive materials and development treatments are carried out to prepare a plurality of image-carrying sheets. Next, the image-carrying sheets are transferred in sequence onto the same intermediate image-receiving sheet to form a multicolor image. At this time, since the individual images formed are transferred one by one in sequence, it is necessary to make the transfer accuracy strict. Namely, the transferability at this time, i.e. the adhesion, slipping-out of position, etc., is significantly influenced by the transfer pressure and transfer temperature. By raising the pressure and temperature on transferring, the adhesion between image-carrying sheet and image-receiving sheet would be improved and an enhancement in sharpness and faithful reproduction of image (dots) may be possible, but the slipping-out of position between said image-carrying sheets would become large. Hence, the transfer is performed there by applying appropriate transfer pressure and transfer temperature within a range that the slipping-out of position between said image-carrying sheets does not occur on transferring. Moreover, also when transferring directly onto the final image receiver without using the intermediate image-receiving sheet, the transfer is performed under similar conditions.

(2) After having transferred the multicolor image onto the final image receiver by the method under (1), the image receiver with the multicolor image formed is submitted to heat treatment using drier, fuser (infrared radiant type) or the like after having been released to remove the support of the image-carrying sheet when transferring the image-carrying sheet directly onto the final image receiver, or after having been released to remove the support of the intermediate image-receiving sheet when transferring onto the final image receiver using an intermediate image-receiving sheet. The temperature for heat treatment at this time is not lower than 60° C., preferably not lower than 80° C. By carrying out this heat treatment, the thermosensitive adhesive layer transferred onto the image receiver together with the colored photosensitive layer is fused, so that the adhesion between said transferred layers, i.e. the colored photosensitive layer and the thermosensitive adhesive layer, is improved and the voids between transferred layers of the respective colors and those between transferred layer and image receiver become not to be present at all. Consequently, there are no round trips of light under neath the images between transferred layers of respective colors and between transferred layer and image receiver with the result that, despite an increase in the image density, the amount of dot gain decreases and the sharpness of image is improved. Moreover, due to the improvement in the adhesion between transferred layer and image receiver, the shape of the surface of image receiver can be reproduced faithfully making it possible to obtain a product resembling closely the finish of printed matter.

At the time of this heat treatment, if one carries out said heat treatment without releasing to remove the support of the image-carrying sheet or that of the intermediate image-receiving sheet, the air in voids between respective transferred layers cannot escape causing the foaming phenomenon or, in such cases as the release surface of the support of the image-carrying sheet or that of the intermediate image-receiving sheet is matted and the like, the heat treatment cannot reproduce faithfully the shape of the surface of final image receiver to obtain the finish depending on the transfer conditions under (1) or the type of the final image receiver. For these reasons, it is preferable to carry out the heat treatment after release of and removal of the support of the image-carrying sheet or that of the intermediate image-receiving sheet.

In the following, the invention will be illustrated concretely based on the examples. However, the support used, the release layer, thermosensitive adhesive layer, colored photosensitive layer, transfer conditions, heat treatment method, etc. in the invention are not confined to those of the examples. The formulation level "part" in the examples indicates part by weight in all cases.

EXAMPLE 1

A. Image-forming materials

| Liquor for providing release layer | |
|---|---|
| Acryl polyol (Thermolac U-245B made by Soken Kagaku Co., Ltd.) | 45 parts |
| Isocyanate (Takenate D-110N made by Takeda Yakuhin Co., Ltd.) | 20 parts |
| Silica (Mizukasil P-572H made by Mizusawa Kagaku Co., Ltd.) | 5 parts |
| Toluene | 100 parts |
| Ethyl acetate | 100 parts |
| Ethyl cellosolve | 50 parts |
| Liquor for providing thermosensitive adhesive layer | |
| Polyester resin (Bironal MA-14 made by Toyobo Co., Ltd.) | 20 parts |
| Isopropyl alcohol | 40 parts |
| Water | 40 parts |
| Liquor for providing colored photosensitive layer | |
| 10% Aqueous solution of SBQ-modified PVA (introduced 1.25 mol % of N-methyl-stilbazole group, average polymerization degree 1700, saponification degree 88%) | 100 parts |
| Pigment dispersion (20% Aqueous dispersion of carbon black) | 4 parts |
| Water | 100 parts |
| Isopropyl alcohol | 10 parts |

Said liquor for providing the release layer was coated with a Meyer bar onto a side of biaxially stretched poly(ethylene terephthalate) film with a thickness of 100 μm, to which the corona discharge treatment had been given beforehand, and dried for 1 minute at 100° C. to provide the release layer with about 3 μm thickness. Further, this coated layer was submitted to the heat treatment for 24 hours at 100° C. to allow it to completely harden. Then, said liquor for providing the thermosensitive adhesive layer was coated thereon with a Meyer bar and dried for 1 minute at 100° C. to provide the thermosensitive adhesive layer with about 1.5 μm thickness. Furthermore, said liquor for providing colored photosensitive layer was coated thereon with a Meyer bar and dried for 1 minute at 100° C. to provide the colored photosensitive layer with about 2 μm thickness and thereby an imageforming material for black was prepared.

Next, using phthalocyanine blue, permanent carmine FB and permanent yellow HR, respectively, instead of carbon black in said liquor for providing colored photosensitive layer, image-forming materials for cyan, magenta and yellow were prepared.

Further, the pigment dispersions were obtained by dispersing for 3 hours ink mill using following formulation.

| Pigment | 60 parts |
|---|---|
| Nonionic surfactant (Mainly polyethylene glycol alkylphenyl ether) | 1 part |
| Water | 240 parts |

B. Intermediate image-receiving sheet.

Said liquor for providing the release layer was coated with a Meyer bar onto a side of biaxially stretched poly(ethylene terephthalate) film with thickness of 125 μm, to which the corona discharge treatment had been given beforehand, and dried for 1 minute at 100° C. to provide the release layer with about 3 μm thickness. Further, this coated layer was submitted to a heat treatment for 24 hours at 100° C. to allow it to completely harden. Then, said liquor for providing the thermosensitive adhesive layer was coated thereon with a Meyer bar and dried for 2 minutes at 100° C. to provide the thermosensitive adhesive layer with about 3 μm thickness to obtain which was made an intermediate image-receiving sheet.

Process 1

At the surface of colored photosensitive layer of said image-forming material for black, a half-tone negative film of color decomposed for black (Indian ink color) plate was allowed to contact it closely under vacuum, and was exposed to light for 30 seconds with 2 KW high-pressure mercury lamp from a distance of 1 m. Thereafter, the non-exposed area was washed and removed with water at ordinary-temperature spouting from a nozzle pressurized to 1 kg/cm² and the remainder was dried for 20 seconds in warm air of 50° C. to obtain a positive image colored in black and to prepare an image-carrying sheet for black.

Also, with respect to image-forming materials for cyan, magenta and yellow, image-carrying sheets of the respective colors were prepared by a similar method using corresponding negative films of colors as decomposed, respectively.

Next, the image surface of the image-carrying sheet for black prepared by the method aforementioned was superposed on the thermosensitive adhesive layer of said intermediate image-receiving sheet and transported through a couple of rollers heated to 105° C. under a pressure of 2 kg/cm² at a speed of 40 cm/min to carry out the heating and pressurizing treatment. Thereafter, during releasing to remove the support of the image-carrying sheet, i.e. poly(ethylene terephthalate) film, the black colored positive image and the thermosensitive adhesive layer were peeled off together from the surface of the release layer of the image-carrying sheet for black and transferred onto the thermosensitive adhesive layer of the intermediate image-receiving sheet. Also, the release layer of the image-carrying sheet was left behind on the side of the poly(ethylene terephthalate) film, the support being released and removed without being transferred. Further, onto the colored-in-black positive image and the thermosensitive adhesive layer thus transferred onto the intermediate image-receiving sheet, image-carrying sheets of respective colors were transferred repeatedly following black in order of yellow, magenta and cyan in sequence by a similar method and under similar conditions to form a multicolor image on the intermediate image-receiving sheet.

Process 2

The imaged surface of this intermediate image-receiving sheet with the multicolor image formed and a coated paper (SK Coat 104.7 g/m² made by Sanyo-Kokusaku Pulp Co., Ltd.) were superposed and together transported through a couple of rollers heated to 110° C. under a pressure of 2 kg/cm² at a speed of 40 cm/min to carry out the heating and pressurizing treatment. Thereafter, by releasing to remove the poly(ethylene terephthalate) film, i.e. the support of the intermediate image-receiving sheet, a four-color positive image was transferred onto the coated paper together with the thermosensitive adhesive layer of the intermediate image-receiving sheet.

Process 3

The process (2) product with four colors transferred onto the coated paper was submitted to heat treatment at 155° C. with an infrared heater. The areal ratio of half-tone dots (for the determination of areal ratio of half-tone dotes, the equation of Murrag-Davies was used to calculate;

Areal ratio of half-tone dots (%) = 100 ×

$$(1 - 10^{-D_T/n})/(1 - 10^{-D_s/n})$$

wherein, n=1, $D_2$=value of solid density when the whiteness of paper is put on 0, $D_T$=value of half-tone dot density when the whiteness of paper is put on 0), the solid density (determined with reflection density meter, Macbeth RD-918) and the saturation of four images showing following color tones (determined with color difference meter, Minolta CR-121, using D65 light source): A (L : 99.8 a : 57.6 b: 97.4), B (L : 82.5 a: −66.5 b : 78.2), C (L : 53:7 a: −8.3 b: −2.3), D (L : 65.7 a : 43.8 b : 18.0) became as follows:

*Saturation = $\sqrt{a^2 + b^2}$

TABLE 1

| Conditions of heat treatment | Black 30% | Black 50% | Black 70% | Cyan 30% | Cyan 50% | Cyan 70% | Magenta 30% | Magenta 50% | Magenta 70% | Yellow 30% | Yellow 50% | Yellow 70% | Saturation A | B | C | D |
|---|---|---|---|---|---|---|---|---|---|---|---|---|---|---|---|---|
| (Upper: Areal ratio of half-tone dots, Lower: Solid density) | | | | | | | | | | | | | | | | |
| Original areal ratio of half-tone dots of half-tone negative manuscript | | | | | | | | | | | | | | | | |
| Process 1 and 2 alone No heat treatment | 51% | 72% 1.72 | 85% | 55% | 77% 1.55 | 90% | 52% | 73% 1.51 | 86% | 50% | 74% 1.52 | 88% | 113 | 103 | 8.6 | 47.4 |
| Heat treatment 155° C. × 10 sec | 46% | 67% 1.80 | 83% | 53% | 76% 1.61 | 90% | 50% | 71% 1.56 | 85% | 49% | 73% 1.59 | 87% | 114 | 104 | 10.3 | 49.5 |
| Heat treatment 155° C. × 20 sec | 45% | 66% 1.81 | 83% | 52% | 76% 1.61 | 89% | 47% | 71% 1.61 | 84% | 49% | 73% 1.67 | 87% | 115 | 106 | 10.4 | 50.2 |

The transferred article onto coated paper submitted to the heat treatment (Process 3) via Process 1 and 2 as in Table 1 showed no slipping-out of position between respective colors and the amount of dot gain decreased while the solid density and the saturation increased in all colors to give a transfer-processed article which is more faithful to the manuscript image and having improved sharpness of image.

Next, other examples are shown in Table 2 and Table 3.

Besides, in Example 2 through 4, too, the procedures were similar to those in Example 1 as far as Process (1) and (2).

TABLE 2

| Conditions of heat treatment | Black 30% | Black 50% | Black 70% | Cyan 30% | Cyan 50% | Cyan 70% | Magenta 30% | Magenta 50% | Magenta 70% | Yellow 30% | Yellow 50% | Yellow 70% | Saturation A | B | C | D |
|---|---|---|---|---|---|---|---|---|---|---|---|---|---|---|---|---|
| (Upper: Areal ratio of half-tone dots, Lower: Solid density) | | | | | | | | | | | | | | | | |
| Original areal ratio of half-tone dots of half-tone negative manuscript | | | | | | | | | | | | | | | | |
| Process 1 and 2 alone No heat treatment | 51% | 72% 1.72 | 85% | 55% | 77% 1.55 | 90% | 52% | 73% 1.51 | 86% | 50% | 74% 1.52 | 88% | 113 | 103 | 8.6 | 47.4 |
| Example 2 Heat treatment 130° C. × 1 min | 47% | 68% 1.79 | 84% | 52% | 76% 1.60 | 90% | 51% | 73% 1.56 | 85% | 49% | 74% 1.61 | 88% | 117 | 104 | 11.7 | 49.5 |
| Example 3 Heat treatment 90° C. × 2 min | 50% | 71% 1.75 | 85% | 54% | 77% 1.57 | 90% | 52% | 73% 1.53 | 86% | 49% | 73% 1.55 | 87% | 114 | 104 | 9.8 | 48.7 |
| Example 4 Heat treatment 90° C. × 5 min | 49% | 71% 1.75 | 85% | 54% | 77% 1.60 | 90% | 52% | 73% 1.56 | 86% | 49% | 73% 1.56 | 87% | 115 | 105 | 10.7 | 49.1 |

TABLE 3

| | Process 1 and 2 alone, No heat treatment | Example 1 Heat treatment 155° C. × 10 sec | Example 1 Heat treatment 155° C. × 20 sec | Example 2 Heat treatment 130° C. × 1 min | Example 3 Heat treatment 90° C. × 2 min | Example 4 Heat treatment 90° C. × 5 min |
|---|---|---|---|---|---|---|
| Finish of image-transferred article Excellent | | | | | | |
| Good | | | | | | |
| Poor | X | | | | | |

As evident from the results of examples above, in accordance with the image transfer method of the invention, a color proof being close to the finish of printing, which is more faithful to the manuscript image and which has more improved sharpness of image compared with those by conventional method, can be prepared.

What is claimed is:

1. An image transfer method in the preparation of a color proof of a multicolor image using photosensitive material for each color component of the multicolor images wherein first a thermosensitive adhesive layer and a thereafter single colored photosensitive layer are coated in sequence onto a release surface of a support, said thermosensitive adhesive layer being releasable from the support, to form a single color image carrying sheet and wherein a separate single-color image carrying sheet is prepared for each color component of the multicolor image, via steps comprising:

(1) a step for forming a separate-in-color image for each color component, wherein a separate-in-color manuscript is closely contacted with a corresponding colored photosensitive layer of a single-color image carrying sheet to expose them to actinic light from the side of manuscript and then the non-image area of the photosensitive layer is removed in the development process, (2) a step for transferring a first component separate-in-color image carrying sheet onto an intermediate image-receiving sheet together with the thermosensitive adhesive layer, wherein the surface of said separate-in-color image thus formed in the separate-in-color image carrying sheet is superposed and contacted with the thermosensitive adhesive layer on an intermediate image-receiving sheet having only thermosensitive adhesive layer on a release surface of support, said thermosensitive adhesive layer being releasable from its support, with concurrently performed heating and pressurizing procedures and then the support of the developed photosensitive material is stripped off to expose the adhesive layer of the single color image carrying sheet leaving said separate-in-color image and exposed thermosensitive adhesive layer upon the intermediate image-receiving sheet, (3) a step for forming a multicolor image on the intermediate image-receiving sheet, wherein further component separate-in-color images are single color formed on the single color colored photosensitive layers in their respective image carrying sheets each of them is sequentially superposed upon the already transferred surface of the intermediate image-receiving sheet produced in step (2) with the developed image in direct contact with the adhesive layer of the previously transferred single color image carrying sheet with concurrently performed heating and pressurizing procedures and then each support of the photosensitive materials is stripped off from each adhesive layer in each single color image carrying sheet to expose said adhesive layer leaving each separate-in-color image and thermosensitive adhesive layer, thereby each separate-in-color image of each component single color image carrying sheet is transferred in sequence onto the already transferred surface of the intermediate image-receiving sheet together with its exposed thermosensitive adhesive layer on the side furthest away from the intermediate image carrying sheet support, (4) a step for forming the multicolor image on an image receiver, wherein the adhesive surface side of the multicolor image formed in step (3) on the intermediate image-receiving sheet is superposed upon the image-receiver with concurrently performed heating and pressurizing procedures and then the support of intermediate image-receiving sheet is stripped off from the release surface, and further (5) a step for submitting the image receiver with the multicolor image formed thereon to heat treatment to fuse the thermosensitive adhesive layers and to remove voids in the image.

2. The image transfer method according to claim 1, wherein said heat treatment is performed by heating devices such as infrared heater, hot-air circulation type drier and steam drier.

3. the image transfer method according to claim 1, wherein said heat treatment is performed at a temperature of not lower than 60° C.

* * * * *